(12) United States Patent
Ishii et al.

(10) Patent No.: US 9,335,344 B2
(45) Date of Patent: May 10, 2016

(54) SIGNAL TRANSMISSION MEDIUM CONVERSION MECHANISM INCLUDING A PROBE TIP AND A FLEXIBLE TRANSMISSION LINE

(75) Inventors: Yasunobu Ishii, Tokyo (JP); Ryo Horie, Tokyo (JP); Shintaro Takase, Tokyo (JP); Wasuke Yanagisawa, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 164 days.

(21) Appl. No.: 13/988,838

(22) PCT Filed: Nov. 24, 2011

(86) PCT No.: PCT/JP2011/077052
§ 371 (c)(1),
(2), (4) Date: Oct. 2, 2013

(87) PCT Pub. No.: WO2012/073785
PCT Pub. Date: Jun. 7, 2012

(65) Prior Publication Data
US 2014/0028413 A1 Jan. 30, 2014

(30) Foreign Application Priority Data
Nov. 29, 2010 (JP) .................................. 2010-265666

(51) Int. Cl.
*G01R 1/067* (2006.01)
*H01P 3/08* (2006.01)
(Continued)

(52) U.S. Cl.
CPC ...... *G01R 1/067* (2013.01); *H01P 3/08* (2013.01); *H01P 3/087* (2013.01); *H01P 5/107* (2013.01); *G01R 1/24* (2013.01); *H01P 5/028* (2013.01)

(58) Field of Classification Search
CPC .......... H01P 3/08; H01P 3/084; H01P 3/085; H01P 3/087; H01P 3/088; H01P 5/107; G01R 1/067
USPC .............................. 333/238, 26; 324/755.01
See application file for complete search history.

(56) References Cited

U.S. PATENT DOCUMENTS 2,877,429 A * 3/1959 Sommers et al. ........... 333/24 R
5,712,607 A    1/1998 Dittmer et al.
(Continued)

FOREIGN PATENT DOCUMENTS

CA    2199655 A1    10/1997
DE    69715715 T2    8/2003
(Continued)

OTHER PUBLICATIONS

Reviewing the Basics of Suspended Striplines, Microwave Journal 2002-10 vol. 45, No. 10, ISSN 0192-6225.

*Primary Examiner* — Benny Lee
(74) *Attorney, Agent, or Firm* — Bachman & LaPointe, PC

(57) ABSTRACT

A signal transmission medium for transmitting EHF band signals from a first point to a second point, including: a first end at which a signal exchange with the first point takes place; a second end at which a signal exchange with the second point takes place; and a transmission line portion which is flexible and connects the first end and the second end. The transmission line portion includes: strip conductors which are formed substantially down a center of a flexible printed circuit board to establish electrical connection between a signal line at the first end and a signal line at the second end; and a pair of grounding sheets which are arranged in parallel to each other at a substantially constant gap from the flexible printed circuit board in 180-degree opposite directions. The cavities are formed between the pair of grounding sheets and the strip conductors.

2 Claims, 6 Drawing Sheets

(51) Int. Cl.
  *H01P 5/107* (2006.01)
  *G01R 1/24* (2006.01)
  *H01P 5/02* (2006.01)

(56) References Cited

U.S. PATENT DOCUMENTS

| | | | |
|---|---|---|---|
| 6,535,088 B1 * | 3/2003 | Sherman et al. | 333/238 |
| 6,759,859 B2 * | 7/2004 | Deng et al. | 324/755.01 |
| 7,352,258 B2 * | 4/2008 | Andrews et al. | 333/26 |

FOREIGN PATENT DOCUMENTS

| | | |
|---|---|---|
| EP | 0801433 A1 | 10/1997 |
| JP | 07-122602 A | 5/1995 |
| JP | 10-041710 A | 2/1998 |
| JP | 2001-349903 A | 12/2001 |
| JP | 2002-290115 A | 10/2002 |
| JP | 2010-263470 A | 11/2010 |
| JP | 2011-71403 A | 4/2011 |

\* cited by examiner (a)

(b)

(a)

(b)

(a)

(b)

SIGNAL TRANSMISSION MEDIUM CONVERSION MECHANISM INCLUDING A PROBE TIP AND A FLEXIBLE TRANSMISSION LINE

TECHNICAL FIELD

The present invention relates to a signal transmission medium for transmitting mainly high frequency signals, such as signals in the extremely high frequency (EHF) band (30 [GHz] to 3,000 [GHz]), between two devices.

BACKGROUND ART

The transmission/reception of signals between devices is stable in wired signal transmission. The signal transmission rate is increasing year after year, and transmitting high frequency signals in the EHF band over a wire is being put into practice. The signal transmission medium used for transmitting signals between devices therefore needs to be capable of handling signals with increased transmission rates as well. In addition to simple signal transmission between two devices, signal transmission media are used in, for example, an evaluation of the characteristics of a semiconductor chip that processes EHF band high frequency signals, for the purpose of connecting the semiconductor chip to be evaluated and a measuring apparatus.

A measurement system for measuring high frequency signals in an evaluation of a semiconductor chip includes, for example, a measuring apparatus whose measurement port includes a waveguide with a flange, and a signal transmission medium. The signal transmission medium includes a transmission line portion which has at one end a probe head provided with a probe tip to be brought into contact with a device to be evaluated and which has at the other end a connector for connecting to the flange of the waveguide. A coaxial cable, a waveguide, a strip line or the like can be used for the transmission line portion.

Coaxial cables are advantageous in structuring the measurement system with relatively less restriction due to their flexibility and ease of wiring. However, the transmission of 110 [GHz] signals, for example, requires a coaxial cable sized 0.4 [mm] or less in the outer diameter of the center conductor and 1 [mm] or less in the inner diameter of the outer conductor. Realizing a coaxial cable of this fineness is difficult from the standpoint of machining accuracy. For that reason, coaxial cables that can be used for 110 [GHz] or higher do not exist at present.

Waveguides and strip lines are superior to coaxial cables in term of the transmission of high frequency signals. However, since waveguides are inflexible and limit the structuring of the measurement system, the measurement system cannot be freely structured. With strip lines, since dielectric substances, which are indispensable to strip lines, increase loss, the increased loss makes accurate measurement difficult.

Thus, there are currently no signal transmission media on the market that are optimum for the transmission of high frequency signals such as EHF band signals between two devices.

Patent Literature 1 and Patent Literature 2, cited below, disclose inventions pertaining to a conventional signal transmission medium used in the measurement system described above. Both inventions are aimed for the transmission of high frequency signals and use as the transmission line portion a strip line that has a probe head at one end. In Patent Literature 3, cited below, a coaxial cable having a probe head at one end is used as the transmission line portion.

Suspended strip lines have been proposed as strip lines that are favorable for the transmission of high frequency signals. An example of suspended strip lines is introduced in Non Patent Literature 1, cited below. Suspended strip lines are said to be superior to conventional strip lines in terms of high Q-factor, wide bandwidth, characteristics stability with respect to temperature, and other points. The suspended strip line introduced in Non Patent Literature 1, cited below, however, is inflexible and therefore limits the structuring of the measurement system.

CITATION LIST

Patent Literature

[PTL 1] JP 7-122602 A
[PTL 2] JP 2002-290115 A
[PTL 3] JP 2001-349903 A

Non Patent Literature

[NPL 1] "Reviewing the Basic of Suspended Striplines" Microwave Journal 2002-10 Vol. 45, No. 10, ISSN 0192-6225

SUMMARY OF THE INVENTION

Technical Problems

The present invention has been made in view of the problems described above, and an object of the present invention is to provide a signal transmission medium which is flexible and is also capable of transmitting high frequency signals.

Solution to Problems

In order to attain the above-mentioned object, according to the present invention, there is provided a signal transmission medium for transmitting EHF band signals from a first point to a second point, including: a first end at which a signal exchange with the first point takes place; a second end at which a signal exchange with the second point takes place; and a transmission line portion which is flexible and connects the first end and the second end. The transmission line portion includes: strip conductors which are formed substantially down a center of a flexible printed circuit board on opposite surfaces thereof and the strip conductor having a ribbon-shape to establish electrical connection between a signal line at the first end and a signal line at the second end; and a pair of grounding sheets which are arranged in parallel to each other at a substantially constant gap from the opposite surface of the flexible printed circuit board, the pair of grounding sheets are partially supported by flexible spacers made from insulating members, and cavities are formed between the pair of grounding sheets and the strip conductors. A signal probe tip which is electrically connected to the strip conductors and grounding probe tips which are electrically connected to the pair of grounding sheets are exposed in at least one of the first end and the second end.

The transmission line portion of the signal transmission medium of the present invention uses the flexible printed circuit board, the grounding sheets, and the flexible spacers to have flexibility. In addition, electric flux lines run in the cavities formed between the grounding sheets and the strip conductors, which reduces transmission loss resulting from dielectric loss in the transmission of high frequency signals, and highly efficient transmission is accomplished as a result.

In the signal transmission medium of the present invention, for example, when a width of each of the strip conductors and a gap between the pair of grounding sheets within the cavities are each less than ¼ of a wavelength of a signal that is transmitted along the strip conductors, high-order mode signal propagation is reduced and a strip line of excellent characteristics is obtained.

In the signal transmission medium of the present invention, for example, the at least one of the first end and the second end may be provided with a transmission medium conversion mechanism for leading a signal that is transmitted along the strip conductors to a different type of high frequency signal transmission medium, in place of the signal probe tip and the grounding probe tips.

In this case, for example, when the different type of high frequency signal transmission medium is a waveguide, the transmission medium conversion mechanism includes a sheet opening formed by removing a part of the pair of grounding sheets that is sized the same as an opening in the waveguide, and an attaching portion which is attached to a flange of the waveguide.

According to the present invention, there is provided a high frequency signal transmission medium for transmitting EHF band signals from a first end to a second end, including: strip conductors which are formed substantially down a center of a flexible printed circuit board on opposite surfaces thereof and the strip conductor having a ribbon-shape to establish electrical connection between the first end and the second end; and a pair of grounding sheets which are arranged in parallel to each other at a substantially constant gap from the opposite surface of the flexible printed circuit board. The pair of grounding sheets are partially supported by flexible spacers made from insulating members, and cavities are formed between the pair of grounding sheets and the strip conductors. A width of each of the strip conductors and a gap between the pair of grounding sheets within the cavities are each less than ¼ of a wavelength of a signal that is transmitted along the strip conductors.

Therefore, the high frequency signal transmission medium is flexible and is small in loss because transmission loss resulting from dielectric loss is very minimal.

A spring-like reinforcing member may be formed along an external surface of the high frequency signal transmission medium. The reinforcing member lessens the effects of an external shock and the like.

Advantageous Effects of Invention

The signal transmission medium of the present invention described above is flexible and is also capable of transmitting high frequency signals because the strip conductors are formed on the flexible printed circuit board having a ribbon-shape and the pair of grounding sheets are partially supported by the flexible spacers. In addition, due to the cavities being formed between the grounding sheets and the strip conductors, transmission loss resulting from dielectric loss in the transmission of high frequency signals is reduced and highly efficient transmission is accomplished.

DETAILED DESCRIPTION OF PREFERRED EMBODIMENTS

An embodiment of the present invention is described below with reference to the drawings in which like features are designated by the same reference number.

Figure 1:
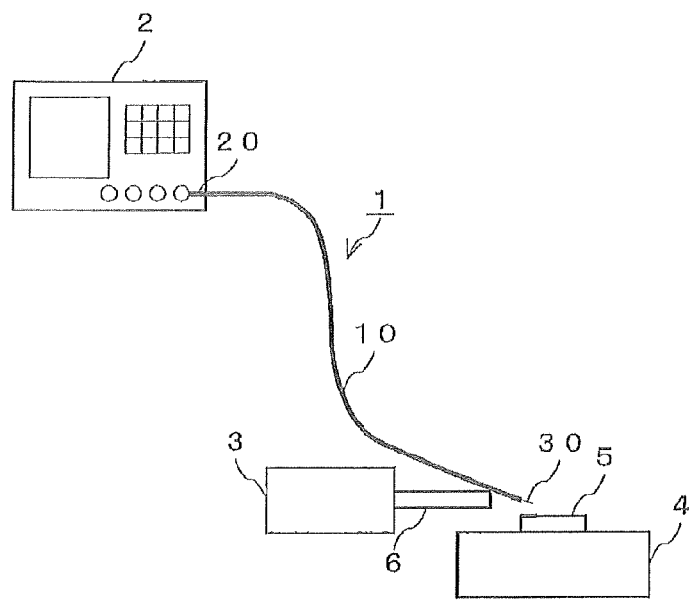
FIG. 1 is an overall structure diagram of a measurement system for evaluating the characteristics of a device to be measured.

This embodiment deals with an example of a signal transmission medium that has a probe portion and a waveguide conversion portion. For the sake of convenience, this type of signal transmission medium is referred to as unitary probe. FIG. 1 is an overall structure diagram of a measurement system that uses the unitary probe to evaluate the characteristics of a device to be measured.

This measurement system is for evaluating the characteristics of a device to be measured 5 which is disposed on a sample stage 4 and which serves as a second point by connecting a unitary probe 1 to a measuring apparatus 2 which serves as a first point and precisely moving the unitary probe 1 with the use of a probe micro-motion device 3 during measurement.

The unitary probe 1 has a transmission line portion 10 which is flexible and which makes the transmission of high frequency signals, for example, EHF band signals, possible. A waveguide conversion portion 20 for exchanging signals between the unitary probe 1 and the measuring apparatus 2 is formed at one end of the transmission line portion 10. Formed at the other end of the transmission line portion 10 is a probe portion 30 for exchanging signals between the unitary probe 1 and the device to be measured 5.

The measuring apparatus 2 indicates the state of a signal in a visible manner by, for example, displaying on a given display a high frequency signal transmitted from the unitary probe 1. The measuring apparatus 2 is provided with a measurement port to which the waveguide conversion portion 20 of the unitary probe 1 is connected.

The measurement port includes a waveguide in order to receive high frequency signals, and the waveguide conversion portion 20 is connected to a flange of the wave guide.

The probe micro-motion device 3 has at the front end thereof a probe supporting portion 6 to which the probe portion 30 of the unitary probe 1 is attached. The probe supporting portion 6 is put into operation by operating the probe micro-motion device 3, and the position of the probe portion 30 is thus moved precisely.

The device to be measured 5 is, for example, a semiconductor chip, and a probe pad is formed on the device to be measured 5 is brought into contact with the probe portion 30 during measurement. The device to be measured 5 can transmit and receive high frequency signals such as EHF band signals. The sample stage 4 on which the device to be measured 5 is placed moves the device to be measured 5 that is fixed onto the sample stage 4 to an optimum position during measurement.

The probe micro-motion device 3 and the sample stage 4 adjust the positions of the probe portion 30 and the device to be measured 5, respectively, so as to bring the probe portion 30 and the device to be measured 5 into contact with each other for measurement.

Figure 2:
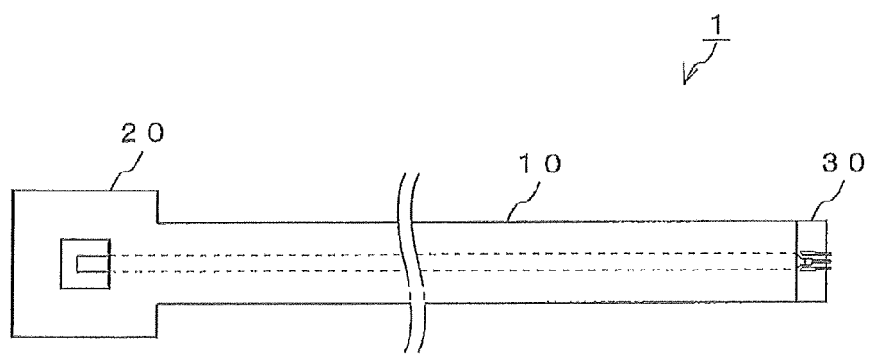
FIG. 2 is an overall structure diagram of a unitary probe.

FIG. 2 is an overall structure diagram of the unitary probe 1.

The unitary probe 1 has, as described above, the transmission line portion 10, the waveguide conversion portion 20, and the probe portion 30 which, in an alternative structure, may be separate parts that are connected to one another only when measurement is conducted. However, the unitary structure is more convenient considering the stability of measurement results and the ease of building the measurement system. A spring-like reinforcing member may be formed along an external surface of the transmission line portion 10. The reinforcing member improves durability against external shocks.

Figure 3:
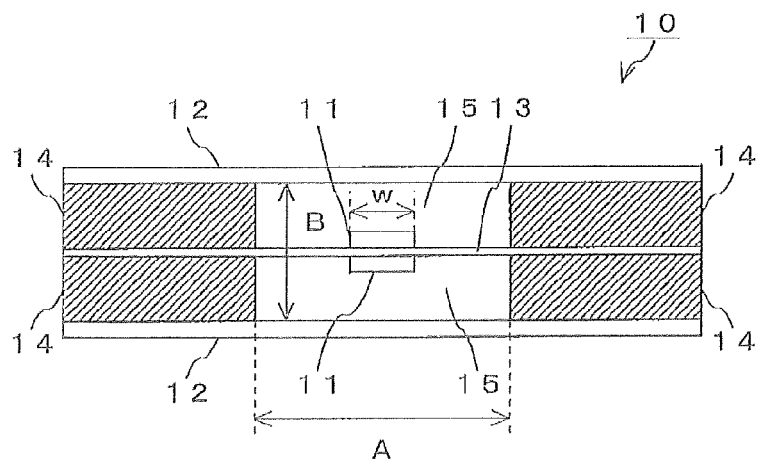
FIG. 3 is a sectional view of a transmission line portion.

The transmission line portion 10 is structured as illustrated in the sectional view of FIG. 3. Specifically, the transmission line portion 10 includes strip conductors 11 and a pair of grounding sheets 12. The strip conductors 11 are linear conductors formed substantially down the center of a flexible printed circuit board 13 on opposite surfaces thereof and the strip conductor having a ribbon-shape. The strip conductors 11 establish electrical connection between a signal line of the waveguide conversion portion 20 and a signal line of the probe portion 30. The pair of grounding sheets 12 are conductive sheets arranged in parallel to each other at a substantially constant gap from the opposite surface of the flexible printed circuit board 13.

The strip conductors 11 and the pair of grounding sheets 12 are desirably made from materials having as high an electrical conductivity as possible, and desirably have smooth surfaces for the same reason. A preferred material of the flexible printed circuit board 13 is small in dielectric loss, is high in insulating properties, and is bendable, for example, an organic insulating sheet material of polyimide, Teflon® (polytetrafluoroethylene), a liquid crystal polymer, or the like.

The pair of grounding sheets 12 are partially supported by flexible spacers 14 which are made from insulating members. With the flexible spacers 14, cavities 15 are formed between the strip conductors 11 and the grounding sheets 12. The flexible spacers 14 are formed from a material similar to that of the flexible printed circuit board 13 to have flexibility.

Thus, the structured transmission line portion 10 serves as a suspended strip line that has flexibility.

The cavities 15 are filled with air, which gives dielectric loss between the strip conductors 11 and the grounding sheets 12 the same value as the loss that is observed in the air. Consequently, the effective relative permittivity ($\in$r) is approximately "1.0" and the effective dielectric loss (tan δ) is substantially "0".

When the strip conductors 11 transmit high frequency signals, electric fields are formed between the strip conductors 11 and the grounding sheets 12 in parallel to the section of the transmission line portion 10. Most of electric flux lines run in the cavities 15. Transmission loss resulting from dielectric loss is therefore minimal and a strip line small in loss is accomplished.

High-order mode signal propagation is reduced and a strip line of excellent characteristics is obtained by setting the width (w) of the strip conductors 11 and the gap (B) between the pair of grounding sheets 12 to values that are less than ¼ of the wavelength of a signal that is transmitted along the strip conductors 11.

In the case of transmitting a high frequency signal that is 100 [GHz], for instance, the wavelength of the signal in the air λo is 3 [mm]. The wavelength of the signal when transmitted along the strip conductors 11 (λ) is the same as the signal's wavelength in the air (λ=λo/√∈r:∈r≈1) because the cavities 15 are filled with air.

The strip conductor 11 width (w) and the gap (B) between the grounding sheets 12 therefore only need to satisfy the following expressions.

(The width $w$ of the strip conductors 11)<λ/4=0.75 [mm]

(The gap $B$ between the grounding sheets 12)<λ/4=0.75 [mm]

In the case where the gap (A) between the flexible spacers 14 is too small, electric fields within the cavities 15 could be drawn in, which affects the transmission mode. It is therefore preferred to set the gap (A) between the flexible spacers 14 to a sufficiently large value at which the electric fields are not affected. The gap (A) in a favorable structure satisfies the following expression.

(The gap $A$ between the flexible spacers 14)≥$n\lambda$ (n: a constant determined by the permittivity of the flexible spacers)

In the transmission line portion 10, the width of the strip conductors 11 and the gap between the grounding sheets 12 can be set narrower when the signal frequency is higher. In other words, the transmission line portion 10 can be built thinner and small in size when the signal frequency is higher.

Figure 4:
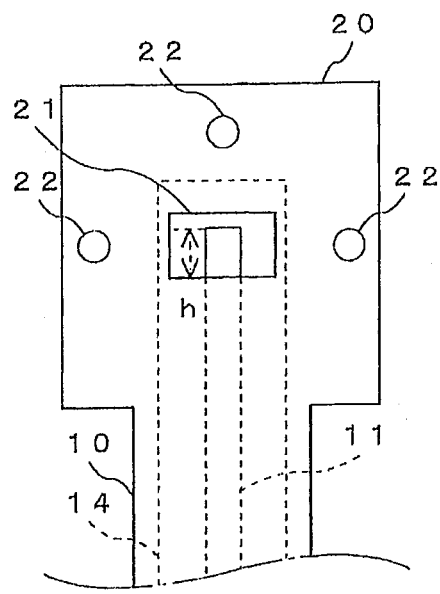
FIG. 4 is a detailed structure diagram of a waveguide conversion portion.

FIG. 4 is a detailed structure diagram of the waveguide conversion portion 20.

The waveguide conversion portion 20 in this embodiment is formed wider than the transmission line portion 10. This is because an opening 21 which is described later is formed in the same size as that of an opening in the waveguide that serves as the measurement port of the measuring apparatus 2 so that the waveguide conversion portion 20 is connected easily to the flange of the waveguide. If the width of the transmission line portion 10 is sufficiently larger than the size of the opening in the waveguide for easy connection to the flange, the waveguide conversion portion 20 does not need to be formed wider than the transmission line portion 10.

The opening 21 is formed in the same size as that of the opening in the waveguide that serves as the measurement port of the measuring apparatus 2 as described above. In the opening 21, the grounding sheets 12 as shown in FIG. 3 and the flexible spacers 14 are removed so that the strip conductors 11 are exposed. The exposed length (h) of the strip conductors 11 that are exposed in the opening 21 corresponds to substantially ¼ of the wavelength of a high frequency signal that is transmitted. In the case of transmitting a high frequency signal that is 100 [GHz], the exposed length (h) is 0.75 [mm]. Screw holes 22 are also provided in the waveguide conversion portion 20, and the waveguide conversion portion 20 is fastened to the flange with screws.

Figure 5:
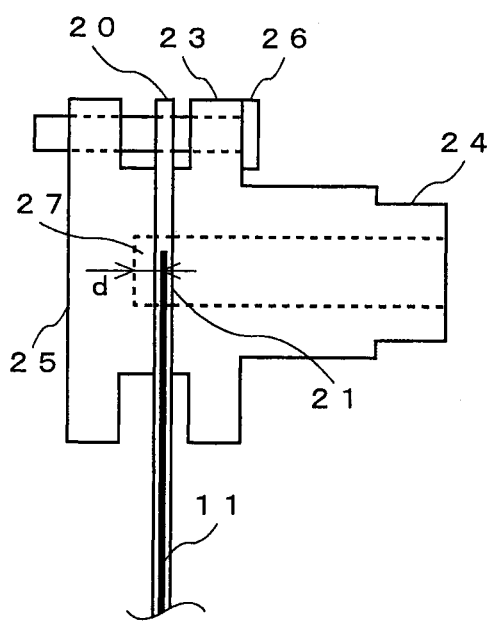
FIG. 5 is a diagram illustrating how the waveguide conversion portion is connected to a measuring apparatus.

FIG. 5 is a diagram illustrating how the waveguide conversion portion 20 is connected to the waveguide 24 that serves as the measurement port of the measuring apparatus 2. The waveguide conversion portion 20 is sandwiched between the flange 23 of the waveguide 24 of the measurement port and an waveguide terminator 25, and is fastened with screws 26. A surface of the flange 23 that faces the waveguide conversion portion 20 and a surface of the waveguide terminator 25 that faces the waveguide conversion portion 20 are respectively in electrical contact with the grounding sheets 12 (FIG. 3) of the waveguide conversion portion 20.

The waveguide terminator 25 is provided with an opening 27, which is in the same size as that of the opening in the waveguide 24. With the waveguide conversion portion 20 fastened, a space from the waveguide 24 to the opening 27 in the waveguide 25 via the opening 21 in the waveguide conversion portion 20 constitutes one continuous cavity. A distance (d) from the bottom of the opening 27 in the waveguide terminator 25 to the strip conductors 11 exposed in the opening 21 in the waveguide conversion portion 20 is set to substantially ¼ of the frequency of a high frequency signal that is transmitted. In the case of transmitting a high frequency signal that is 100 [GHz], the distance (d) is 0.75 [mm].

With the waveguide conversion portion 20 connected to the waveguide 24 by this structure, signals are propagated efficiently between the unitary probe 1 and the measuring apparatus 2.

Figure 6:
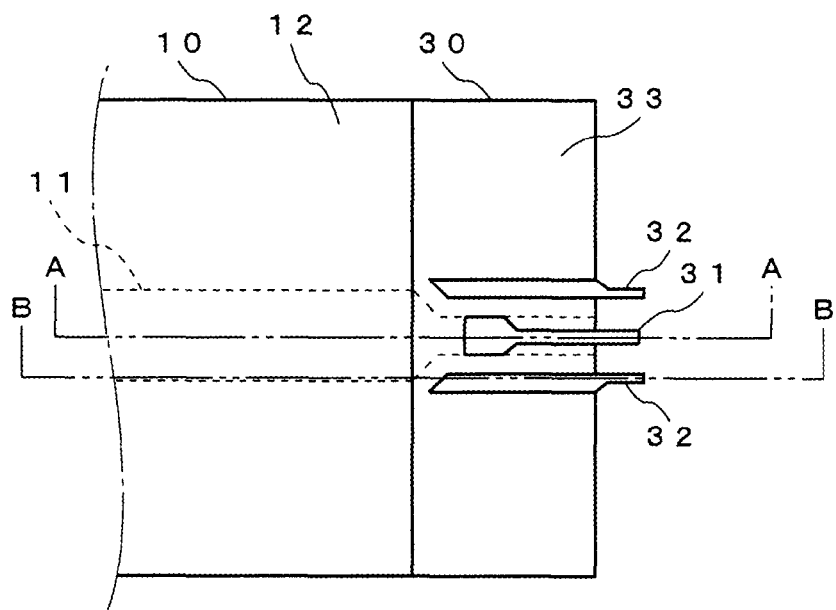
FIG. 6 is an enlarged view of a junction between the transmission line portion and a probe portion.

FIG. 6 is an enlarged view of a junction between the transmission line portion 10 and the probe portion 30.

The probe portion 30 is structured by forming a dielectric layer 33 on the transmission line portion 10 and providing a signal probe tip 31 and two grounding probe tips 32 on the dielectric layer 33. The dielectric layer 33 separates the signal probe tip 31 and the two grounding probe tips 32 from one of the grounding sheets 12 of the transmission line portion 10. The strip conductors 11 of the transmission line portion 10 are tapered in the probe portion 30 to have a width substantially equal to the width of the signal probe tip 31 at its proximal end. The cavities 15 (FIG. 3) are filled with dielectric spacers in a part of the transmission line portion 10 that is under the probe portion 30.

Figure 7:
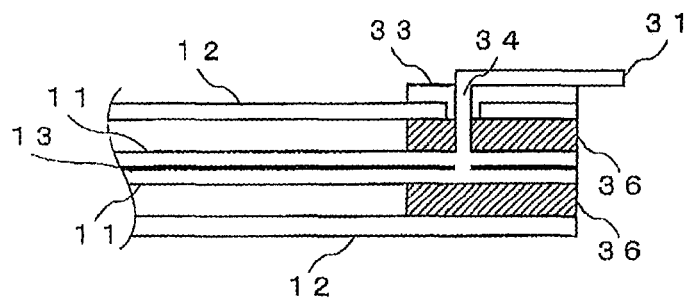
FIG. 7 is a sectional view taken along the line A-A of FIG. 6.

The signal probe tip 31 is connected to the strip conductors 11. FIG. 7 is a sectional view taken along the line A-A of FIG. 6, and illustrates how the signal probe tip 31 is connected to the strip conductors 11.

The signal probe tip 31 is connected at the proximal end to the strip conductors 11 through a signal via 34. The signal via 34 pierces the dielectric layer 33, one of the grounding sheets 12, the dielectric spacers 36, and the flexible printed circuit board 13 to connect to the strip conductors 11. The dielectric layer 33 is formed also between the signal via 34 and one of the grounding sheets 12 in order to separate the signal via 34 from the grounding sheet 12.

Figure 8:
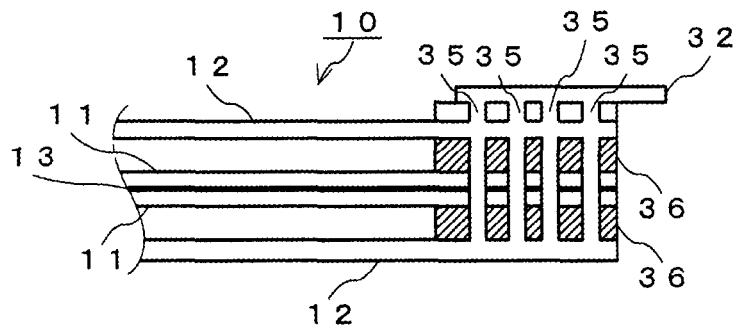
FIG. 8 is a sectional view taken along the line B-B of FIG. 6.

The grounding probe tips 32 are connected to the grounding sheets 12. FIG. 8 is a sectional view taken along the line B-B of FIG. 6, and illustrates how the grounding probe tips 32 are connected to the grounding sheets 12. The two grounding probe tips 32 are connected to the grounding sheets 12 in the same manner.

The grounding probe tips 32 are connected at the proximal ends to the grounding sheets 12 through grounding vias 35. The grounding vias 35 pierce the dielectric layer 33 and the dielectric spacers 36 to connect to the two grounding sheets 12. The grounding vias 35 are offset from the position of the strip conductors 11, and therefore do not affect the strip conductors 11.

The front length and gap of the front ends of the signal probe tip 31 and the two grounding probe tips 32 are adjusted so as to match the arrangement of the probe pad formed on a surface of the device to be measured 5.

<Manufacturing Method>

Next, a description is given with reference to FIGS. 9(a), 9(b), 10(a), 10(b), 11(a) and 11(b) on a method of manufacturing the transmission line portion 10 of the unitary probe 1 which is structured as described above.

Figure 9:
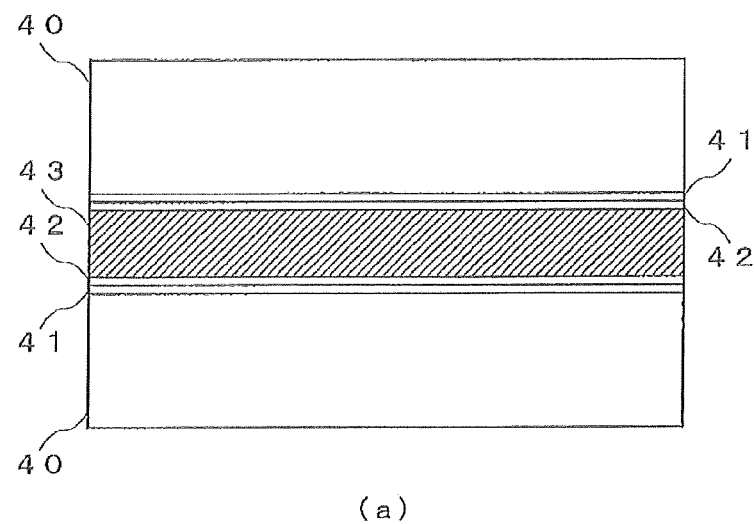
FIGS. 9(a) and 9(b) are explanatory diagrams of a method of manufacturing flexible spacers.
Figure 9:
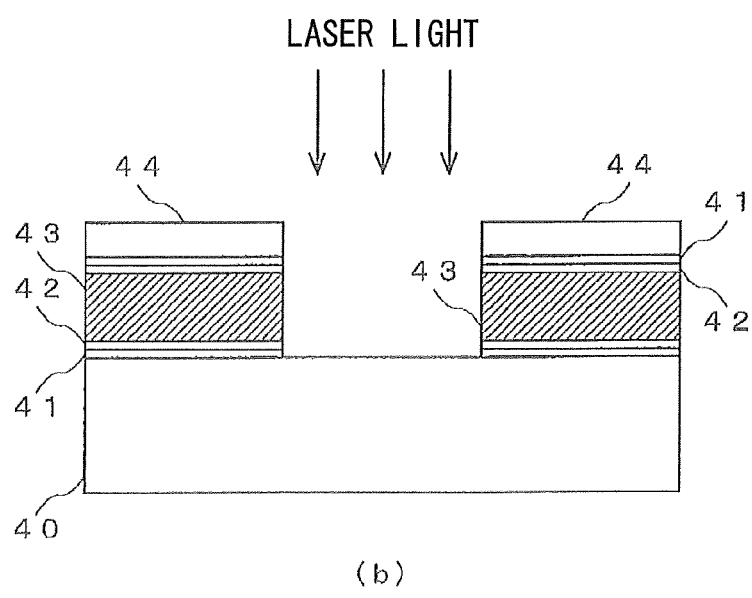

FIGS. 9(a) and 9(b) are diagrams illustrating a method of manufacturing the flexible spacers 14 of FIG. 3.

First, as illustrated in FIG. 9(a), a separator film 41, an adhesive sheet 42, a polyimide layer 43 which forms the flexible spacers 14, another adhesive sheet 42, and another separator film 41 are layered in the order stated and sandwiched between two jigs 40 in order to temporarily bond the layers. The adhesive sheets 42 use, for example, an epoxy-based adhesive, and are formed to a thickness of 25 [μm] each. The separator films 41 are used to prevent the adhesive sheets 42 from adhering to the jigs 40, and are removed after the flexible spacers 14 are manufactured.

The thickness of the polyimide layer 43 which determines the gap B in FIG. 3 between the grounding sheets 12 is determined by the frequency of a signal that is transmitted by the transmission line portion 10.

After the layers are temporarily bonded, one of the jigs 40 is removed as illustrated in FIG. 9(b), and a metal mask 44 is placed on a surface exposed by the removal. The layers are irradiated with laser light from the side of the metal mask 44, to thereby remove parts of the separator films 41, the adhesive sheets 42, and the polyimide layer 43 that are not masked by the metal mask 44. The remaining parts of the polyimide layer 43 constitute the flexible spacers 14. The dimensions of an opening made by the metal mask 44 determine the gap A in FIG. 3 between the flexible spacers 14. Accordingly, the dimensions of the opening made by the metal mask 44 are determined by the permittivity of the polyimide layer 43 and by the frequency of a signal that is transmitted by the transmission line portion 10 of FIG. 3.

After the separator films 41, the adhesive sheets 42, and the polyimide layer 43 are removed by laser processing, the metal mask 44 is removed. The flexible spacers 14 are manufactured in this manner.

Figure 10:
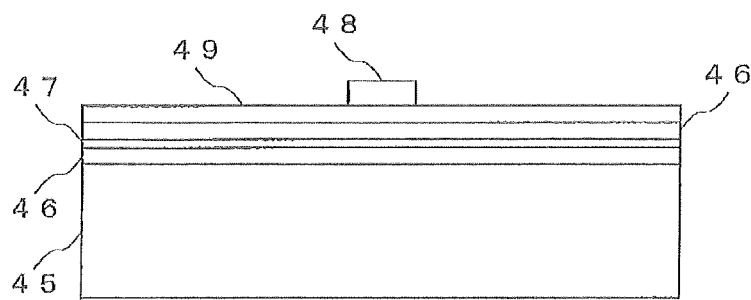
FIGS. 10(a) and 10(b) are explanatory diagrams of a method of manufacturing strip conductors.
Figure 10:
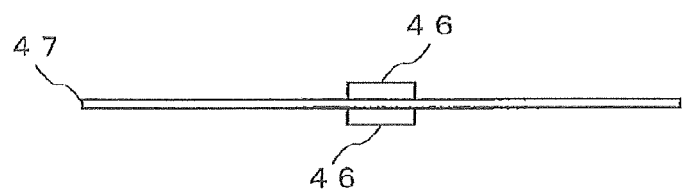

FIGS. 10(a) and 10(b) are diagrams illustrating a method of manufacturing the strip conductors 11 of FIG. 3.

First, as illustrated in FIG. 10(a), a metal sheet 46 which is made of metal, for example, copper, a polyimide layer 47 which forms the flexible printed circuit board 13, and another metal sheet 46 are layered in the order stated on a jig 45. A photoresist sheet 49 is layered thereon by press fitting, and a mask 48 is further disposed. The width of the mask 48 determines the width w in FIG. 3 of the finished strip conductors 11. In this state, the photoresist sheet 49 is developed and removed by photolithography such as the irradiation of ultraviolet rays, leaving a part that is covered with the mask 48. The part of the photoresist sheet 49 that remains after the development and removal is used as an etching mask for removing one of the metal sheets 46, and the metal sheet 46 is removed leaving a part that is covered with the photoresist sheet 49. On the other side of the polyimide layer 47, too, the metal sheet 46 is removed by photolithography. This leaves the metal sheet 46 that has a given width on each side of the polyimide layer 47 as illustrated in FIG. 10(b). The metal sheets 46 remaining on the both sides of the polyimide layer 47 constitute the strip conductors 11.

Figure 11:
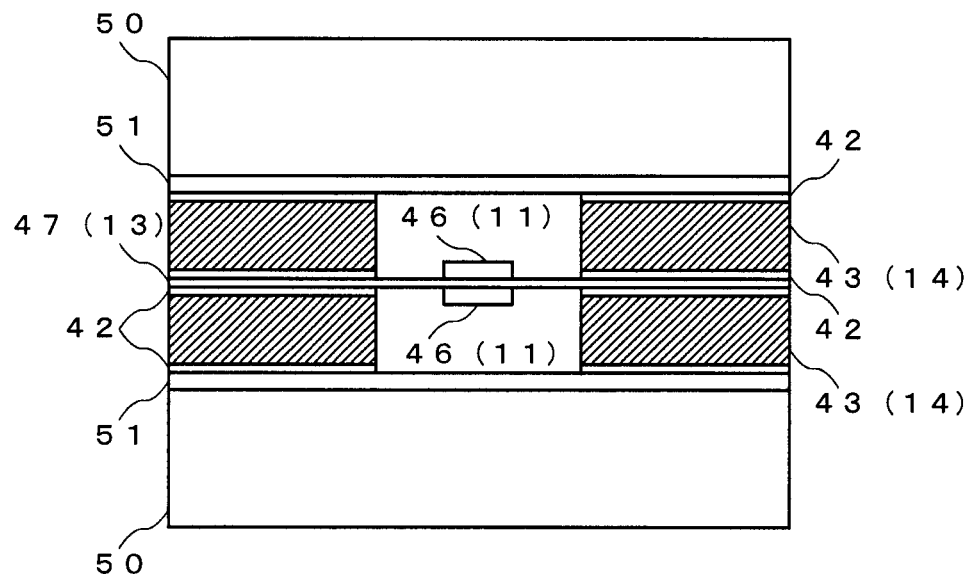
FIGS. 11(a) and 11(b) are explanatory diagrams of a method of manufacturing the transmission line portion by bonding the strip conductors and the flexible spacers.
Figure 11:
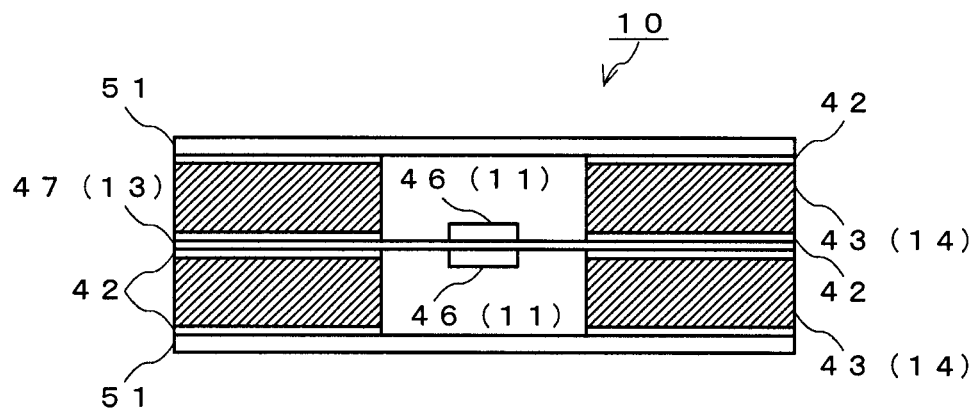

FIGS. 11(a) and 11(b) are diagrams illustrating a method of manufacturing the transmission line portion 10 by bonding the strip conductors 11 and the flexible spacers 14.

First, a metal sheet 51 which is made from metal, for example, copper, to form one of the grounding sheets 12 is formed on a jig 50. One of the flexible spacers 14 manufactured in FIG. 9(b) is bonded onto the metal sheet 51. At this point, the adhesive sheet 42 is used to bond the metal sheet 51. Two of these structures are prepared, and the polyimide layer 47 which forms the flexible printed circuit board 13 of the strip conductors 11 manufactured in FIG. 10(b) is sandwiched between the two structures. At this point, the adhesive sheet 42 is used to bond the polyimide layer 47.

The strip conductors 11 manufactured in FIG. 10(b) are thus sandwiched between the two flexible spacers 14 manufactured in FIG. 9(b) as illustrated in FIG. 11(a), and then press-fit at a high temperature.

Thereafter, as illustrated in FIG. 11(b), the jigs 50 {FIG. 11(A)} are removed and hems in the transmission line portion 10 are cut and shaped as necessary, thereby completing the transmission line portion 10. The unitary probe 1 is manufactured by attaching the waveguide conversion portion 20 to one end of the finished transmission line portion 10 and attaching the probe portion 30 to the other end of the finished transmission line portion 10 as shown in FIG. 1.

Modification Example

The description given above employs a mode in which the measuring apparatus 2 measures an output from the device to be measured 5. The present invention is also applicable to a mode in which power is fed from the probe portion 30 to the device to be measured 5. In other words, the present invention may employ a structure in which an input signal from a signal generator or the like is input to the device to be measured 5 by the unitary probe 1, in addition to a structure in which an output signal from the device to be measured 5 is transmitted to the measuring apparatus 2 by the unitary probe 1.

The probe portion 30 of the unitary probe 1 may be replaced with the waveguide conversion portion 20 so that the waveguide conversion portion 20 may be formed in both ends of the transmission line portion 10.

In this structure, two waveguides can be connected to each other by the transmission line portion 10. This makes it possible to transmit high frequency signals between two devices via the transmission line portion 10 in the case where the waveguides constitute an input port of one of the devices and an output port of the other device.

The waveguide conversion portion 20 of the unitary probe 1 may be replaced with the probe portion 30 so that the probe portion 30 may be attached to both ends of the transmission line portion 10.

In this structure, high frequency signals can be transmitted between two sites by connecting one of the sites and the other site to each other with the probe portions 30.

The signal transmission medium may also be structured solely from the flexible transmission line portion 10. In other words, the waveguide conversion portion 20 and the probe portion 30 may be omitted, and, instead, various connectors or signal conversion lines (not shown) may be connected to the flexible transmission line portion 10. In this way, the present invention can be applied more flexibly to high frequency signal transmission purposes while making the most of the characteristics of the flexible transmission line portion 10.

Alternatively, a plurality of strip conductors 11 may be formed. For instance, using two strip conductors 11 is suitable for the transmission of so-called differential signals, and a high-speed differential signal transmission medium may be structured from one flexible printed circuit board 13 having a ribbon-shape.

REFERENCE SIGNS LIST

1 . . . unitary probe, 10 . . . transmission line portion, 11 . . . strip conductor, 12 . . . grounding sheet, 13 . . . flexible printed circuit board, 14 . . . flexible spacer, 15 . . . cavity, 20 . . . waveguide conversion portion, 21 . . . opening, 22 . . . screw hole, 23 . . . flange, 24 . . . waveguide, 25 . . . waveguide terminator, 26 . . . screw, 27 . . . opening, 30 . . . probe portion, 31 . . . signal probe tip, 32 . . . grounding probe tip, 33 . . . dielectric layer, 34 . . . signal via, 35 . . . grounding via, 36 . . . dielectric spacer, 2 . . . measuring apparatus, 3 . . . probe micromotion device, 4 . . . sample stage, 5 . . . device to be measured, 6 . . . probe supporting portion, 40, 45, 50 . . . jig, 41 . . . separator film, 42 . . . adhesive sheet, 43, 47 . . . polyimide layer, 44 . . . metal mask, 46, 51 . . . metal sheet, 48 . . . mask, 49 . . . photoresist sheet

The invention claimed is:

1. A signal transmission medium for transmitting EHF band signals from a first point to a second point, comprising:
a first end at which a signal exchange with the first point takes place;
a second end at which a signal exchange with the second point takes place; and
a transmission line portion which is flexible and connects the first end and the second end,
wherein the transmission line portion comprises:
strip conductors which are formed substantially along a center of a flexible printed circuit board on opposite surfaces thereof, said strip conductors each having a ribbon-shape to establish electrical connection between a signal line at the first end and a signal line at the second end; and
a pair of grounding sheets which are arranged in parallel to each other at a substantially constant gap from the opposite surfaces of the flexible printed circuit board,
wherein the pair of grounding sheets are partially supported by flexible spacers made from insulating members,
wherein spaces between the pair of grounding sheets and the spacers form cavities that surround the strip conductors, and
wherein a signal probe tip is electrically connected to the strip conductors and grounding probe tips are electrically connected to the pair of grounding sheets and are exposed in at least one of the first end and the second end,
wherein the signal probe tip and the grounding probe tips comprise a transmission medium conversion mechanism for leading a signal that is transmitted along the strip conductors to a different type of high frequency signal transmission medium,
wherein the different type of high frequency signal transmission medium comprises a waveguide, and
wherein the transmission medium conversion mechanism comprises a sheet opening formed by removing a part of the pair of grounding sheets that is sized the same as an opening in the waveguide, and an attaching portion which is attached to a flange of the waveguide.

2. A signal transmission medium according to claim 1, wherein a width of each of the strip conductors and a gap between the pair of grounding sheets within the cavities are each less than ¼ of a wavelength of a signal that is transmitted along the strip conductors.

* * * * *